(12) United States Patent
Sa et al.

(10) Patent No.: US 12,417,898 B2
(45) Date of Patent: Sep. 16, 2025

(54) SUBSTRATE PROCESSING APPARATUS

(71) Applicant: JUSUNG ENGINEERING CO., LTD., Gwangju-si (KR)

(72) Inventors: Seung Youb Sa, Bucheon-si (KR); Kwang Su Park, Gwangju-si (KR); Ho Boem Her, Incheon (KR); Chul Joo Hwang, Seongnam-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 350 days.

(21) Appl. No.: 18/125,716

(22) Filed: Mar. 23, 2023

(65) Prior Publication Data

US 2023/0290610 A1 Sep. 14, 2023

Related U.S. Application Data

(63) Continuation of application No. PCT/KR2021/010377, filed on Aug. 6, 2021.

(30) Foreign Application Priority Data

Oct. 13, 2020 (KR) .................. 10-2020-0131532
Jul. 29, 2021 (KR) .................. 10-2021-0099590

(51) Int. Cl.
*H01J 37/32* (2006.01)
(52) U.S. Cl.
CPC ..... *H01J 37/3211* (2013.01); *H01J 37/32449* (2013.01); *H01J 37/32458* (2013.01);
(Continued)
(58) Field of Classification Search
CPC ............. H01J 37/3211; H01J 37/32449; H01J 37/32458; H01J 37/32715;
(Continued)

(56) References Cited

U.S. PATENT DOCUMENTS

2014/0261185 A1* 9/2014 Aboagye ........... C23C 16/45504
118/728
2014/0273410 A1 9/2014 Abedijaberi et al.
(Continued)

FOREIGN PATENT DOCUMENTS

JP H0969399 A 3/1997
JP 2011096689 A 5/2011
(Continued)

OTHER PUBLICATIONS

International Search Report for PCT/KR2021/010377 mailed Nov. 8, 2021.

*Primary Examiner* — Minh Tran
(74) *Attorney, Agent, or Firm* — Renaissance IP Law Group LLP

(57) ABSTRACT

A substrate processing apparatus includes a chamber having a sidewall; a susceptor mounting a substrate inside the chamber, an upper dome covering an upper surface of the chamber and formed of a transparent dielectric material, and an antenna disposed on the upper dome to generate inductively coupled plasma. The antenna includes two one-turn unit antennas, the wo one-turn unit antennas each has an upper surface and a lower surface and are disposed to overlap each other on the upper surfaces and the lower surfaces of the two one-turn unit antennas, the two one-turn unit antennas are connected in parallel and are connected to a radio-frequency (RF) power supply, and a width direction of each of the one-turn unit antennas stands upright vertically.

19 Claims, 10 Drawing Sheets

(52) U.S. Cl.
CPC .................. *H01J 37/32715* (2013.01); *H01J 37/32798* (2013.01); *H01J 2237/3321* (2013.01)

(58) Field of Classification Search
CPC ......... H01J 37/32798; H01J 2237/3321; H01J 37/321; H01J 37/32119; H01J 37/3222; H01J 37/3244; C30B 25/08; C30B 25/10; C30B 25/14
See application file for complete search history.

(56) References Cited

U.S. PATENT DOCUMENTS

| | | | |
|---|---|---|---|
| 2014/0322897 A1 | 10/2014 | Samir et al. | |
| 2015/0162230 A1* | 6/2015 | Bautista | C30B 25/10 118/500 |
| 2017/0229303 A1 | 8/2017 | Yan et al. | |
| 2018/0355510 A1* | 12/2018 | Park | C30B 25/12 |
| 2020/0152493 A1* | 5/2020 | Colombeau | H01L 21/67196 |
| 2020/0332437 A1* | 10/2020 | Burrows | H01L 21/0254 |

FOREIGN PATENT DOCUMENTS

| | | |
|---|---|---|
| JP | 2015062181 A | 4/2015 |
| JP | 2016519208 A | 6/2016 |
| JP | 2017501570 A | 1/2017 |
| KR | 20030011646 A | 2/2003 |
| KR | 20070022453 A | 2/2007 |
| KR | 20100006009 A | 1/2010 |
| KR | 20150130479 A | 11/2015 |
| KR | 101810645 B1 | 1/2018 |
| KR | 20200089979 A | 7/2020 |
| TW | 201003815 A | 1/2010 |
| TW | 201447032 A | 12/2014 |
| TW | 201523771 A | 6/2015 |

* cited by examiner

SUBSTRATE PROCESSING APPARATUS

This application is a continuation of PCT/KR2021/010377 filed on Aug. 6, 2021, which claims priorities to Korea Patent Application No. 10-2020-0131532 filed on Oct. 13, 2020 and Korea Patent Application No. 10-2021-0099590 filed on Jul. 29, 2021, the entireties of which are both hereby incorporated by reference.

TECHNICAL FIELD

The present disclosure relates to a plasma substrate processing apparatus and, more particularly, to an epitaxial plasma enhanced chemical vapor deposition apparatus for rapidly heating a substrate at high temperature using a lamp heater to deposit a thin film.

BACKGROUND

In semiconductor fabrication, a single-crystalline silicon thin film having the same crystal structure as a single-crystalline silicon substrate is deposited on the substrate. When the single-crystalline silicon thin film is grown, an inorganic insulating material such as silicon oxide is deposited and patterned to form a single-crystalline region only in a silicon-exposed portion of a semiconductor surface, which is referred to as selective epitaxial growth (SEG).

In addition, in manufacturing of a thin-film solar cell on a large-area substrate, a P-type layer for receiving sunlight, an I-type layer for forming an electron-hole pair, and an N-type layer serving as an opposite electrode of the P-type layer are the basic elements. Similarly, a liquid crystal display (LCD) device is based on an array element and a color filter element, respectively formed on an array and a color filter substrate.

A photolithography process is required to be performed several times to fabricate a thin film element for a solar cell and a liquid crystal display device. Such a photolithography process includes a thin film deposition process, a photosensitive layer coating process, an exposure and development process, and an etching process. In addition, such a photolithography process accompanies various processes such as a cleaning process, an attaching process, a cutting process, and the like.

Plasma-enhanced chemical vapor deposition (hereinafter referred to as "PECVD") is a process by which a thin film is formed while reaction gas is excited into a plasma state inside a chamber by applying a radio-frequency (RF) high voltage to an antenna or an electrode.

Recently, to prevent foreign substances or byproducts generated during a deposition process using PECVD from adhering to an inner wall of a chamber, the inner wall is designed with quartz, and an upper dome and a lower dome are designed with quartz in an upper portion and a lower portion of the chamber.

In a deposition process using such PECVD, a pressure inside a chamber is maintained at several mTorr and is maintained in an ultra-high vacuum state of 10E-9 Torr in a base vacuum state to significantly decrease the number of foreign substances or byproducts generated during the deposition process and to reduce a time for the deposition process, resulting in an advantage for improving production yield.

Such PECVD has issues in which an antenna disposed on an upper dome is heated by infrared light to deteriorate plasma stability and the antenna deteriorates uniformity of a thin film through infrared reflection. Accordingly, a novel plasma source and thin film deposition method is required.

SUMMARY

An aspect of the present disclosure is to provide an antenna capable of stably generating plasma even by external infrared heating and a substrate processing apparatus including the same.

An aspect of the present disclosure is to provide a substrate processing apparatus in which contamination of lower dome and a lower liner is reduced.

An aspect of the present disclosure is to provide a substrate processing apparatus for securing uniformity by uniform substrate heating achieved by a shape of a clamp, a shape of a housing, and gold plating.

An aspect of the present disclosure is to provide a substrate processing apparatus for simultaneously providing uniform infrared heating and uniform plasma.

An aspect of the present disclosure is to provide a substrate process apparatus for providing a uniform process using an antenna generating plasma and a resistive heater embedded in an antenna housing disposed to cover the antenna.

A substrate processing apparatus according to an embodiment includes: a chamber having a sidewall; a susceptor mounting a substrate inside the chamber; an upper dome covering an upper surface of the chamber and formed of a transparent dielectric material; and an antenna disposed on the upper dome to generate inductively coupled plasma. The antenna includes two one-turn unit antennas, the two one-turn unit antennas each has an upper surface and a lower surface and are disposed to overlap each other on the upper surfaces and the lower surfaces of the two one-turn unit antennas, the two one-turn unit antennas are connected in parallel and are connected to a radio-frequency (RF) power supply, and a width direction of each of the one-turn unit antenna stands upright vertically.

In an example embodiment, the substrate processing apparatus may further include: a funnel-shaped lower dome covering a lower surface of the chamber and formed of a transparent dielectric material; a concentric lamp heater disposed on a lower surface of the lower dome; a ring-shaped upper liner disposed on an internal side of the chamber to surround a lower side edge of the upper dome and formed of a dielectric material; a ring-shaped lower liner disposed on an internal side of the chamber to surround an upper edge internal circumferential surface of the lower dome and formed of a dielectric material; and a reflector disposed on a lower surface of the concentric lamp heater.

In an example embodiment, the one-turn unit antenna may be in the form of a strip line having a width greater than a thickness, a width direction of the one-turn unit antenna may stand upright vertically, and a ratio of the width W to the thickness t (W/t) may be 10 or more.

In an example embodiment, the one-turn unit antenna may include: a radial portion extending from the upper surface in a radial direction from a center of the one-turn unit antenna; a first curved portion extending from the upper surface by rotating 90 degrees clockwise along a circumference having a first radius in the radial portion; a first vertical extension portion changing an arrangement plane from the upper surface to the lower surface in the first curved portion; a second curved rotating 180 degrees clockwise along the circumference having the first radius in the first vertical extension portion; a second vertical extension portion continuously connected to the second curved portion, changing a radius from the first radius to a second radius smaller than the first radius, changing an arrangement plane from the lower surface to the upper surface, and changing a radius from the second radius to the first radius; and a third curved portion extending from the upper surface by rotating 90 degrees clockwise along the circumference having the first radius from the second vertical extension portion.

In an example embodiment, the substrate processing apparatus may further include an antenna housing disposed to surround the antenna and coated with a reflector.

In an example embodiment, the substrate processing apparatus may further includes: at least one process gas supply part supplying a process gas through a side surface of the upper line; and a flow path through which a purge gas, supplied through the lower dome, is supplied.

In an example embodiment, the upper liner may include: a first opening formed one side of the upper liner to exhaust a gas; and a second opening disposed in the upper liner to provide a substrate path to the other side opposing a first opening of the upper line.

In an example embodiment, the lamp heater may include a plurality of ring-shaped lamp heaters, the ring-shaped lamp heaters may be arranged at regular intervals along an inclined surface of the lower dome, and the ring-shaped lamp heaters may be divided into three groups to independently receive power.

In an example embodiment, the substrate processing apparatus may further include: a first substrate lifter disposed along a central axis of the lower dome; and a second substrate lifter disposed to be coaxial with the first substrate lifter.

In an example embodiment, the substrate processing apparatus may further include a ring-shaped heat insulating part disposed between a lower surface of the chamber and the reflector.

In an example embodiment, the substrate processing apparatus may further include a lower liner disposed on an internal circumferential surface of the lower dome and formed of an opaque dielectric material.

In an example embodiment, the lower liner may have an internal circumferential surface facing a space of the lower dome, and the internal circumferential surface of the lower liner may have an inclination in which a thickness is increased in a vertical direction toward an upper region from a lower region of the chamber.

In an example embodiment, the substrate processing apparatus may further include: a lower dome covering a lower surface of the chamber, formed of a transparent dielectric material, and having the same curvature as the upper dome; a lamp heater disposed on a lower surface of the lower dome; a ring-shaped upper liner disposed on an internal side of the chamber to surround a lower side edge of the upper dome and formed of a dielectric material; a ring-shaped lower liner disposed on the internal side of the chamber to surround an upper edge internal circumferential surface of the lower dome and formed of a dielectric material; and a reflector disposed on a lower surface of the lamp heater.

In an example embodiment, the substrate processing apparatus may further include an antenna housing disposed to surround the antenna. The antenna housing may be heated by a separate heater.

In an example embodiment, a temperature of the antenna housing may range from 200 degrees Celsius to 600 degrees Celsius.

In an example embodiment, the substrate processing apparatus may further include a chamber housing disposed to surround the antenna housing while being spaced apart from the antenna housing. The chamber housing may be cooled by a refrigerant.

Another aspect of the present disclosure is to provide a method of operating a substrate processing apparatus including a chamber having a sidewall, a susceptor mounting a substrate inside the chamber, an upper dome covering an upper surface of the chamber and formed of a transparent dielectric material, an antenna disposed on the upper dome to generate inductively coupled plasma, a lower dome covering a lower surface of the chamber and formed of a transparent dielectric material, a ring-shaped upper liner disposed on an internal side of the chamber to surround a lower side edge of the upper dome and formed of a dielectric material; a ring-shaped lower liner disposed on an internal side of the chamber to surround an upper edge internal circumferential surface of the lower dome and formed of a dielectric material, a lamp heater disposed below the lower dome, and an antenna housing disposed to cover the antenna and heated by a heater. The method may include: heating the antenna housing by the heater to a first temperature; accommodating the substrate in a home position of the susceptor and lifting the susceptor to change a position of the substrate to a process position; supplying a process gas to the upper dome, supplying a purge gas to the lower dome, and heating the substrate using the lamp heater; and supplying radio-frequency (RF) power to the antenna to generate inductively coupled plasma to perform epitaxial growth on the substrate.

A substrate processing apparatus according to another embodiment may include: a chamber having a side wall, an upper region, and a lower region; a susceptor mounting a substrate inside the chamber; an upper dome covering an upper surface of the chamber and formed of a transparent dielectric material; a lower dome covering a lower surface of the chamber and formed of a transparent dielectric material; and a lower liner disposed on an upper edge internal circumferential surface of the lower dome and formed of an opaque transparent material.

In an example embodiment, the substrate processing apparatus may further include a lamp heater disposed below the lower dome.

In an example embodiment, the lower liner may have an internal circumferential surface facing a space of the lower dome, and the internal circumferential surface of the lower liner may have an inclination in which a width is increased in a vertical direction toward an upper region from a lower region of the chamber.

In an example embodiment, the lower liner may be formed of quartz.

A substrate processing apparatus according to another embodiment may include: a chamber having a side wall, an upper region, and a lower region; a susceptor mounting a substrate inside the chamber; an upper dome covering an upper surface of the chamber and formed of a transparent dielectric material; a lower dome covering a lower surface of the chamber and formed of a transparent dielectric material; a substrate entrance disposed on one side of a sidewall of the chamber; and an exhaust port disposed on the other side of the sidewall of the chamber. An upper surface of the exhaust port has the same height as or a smaller height than an upper surface of the substrate entrance.

In an example embodiment, the substrate processing apparatus may further include a ring-shaped upper liner disposed on an internal side of the chamber to surround a lower side edge of the upper dome and formed of a transparent dielectric material; and a ring-shaped lower liner disposed on the internal side of the chamber to surround an upper edge internal circumferential surface of the lower dome and formed of an opaque dielectric material.

In an example embodiment, the upper liner may include: a first opening aligned with the exhaust port and formed on one side of the upper liner to exhaust a gas; and a second opening aligned with the substrate entrance and disposed in the upper line to provide a substrate path to the other side opposing the first opening of the upper liner. An upper surface of the susceptor may be higher than lower surfaces of the exhaust port and the substrate entrance during a process.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
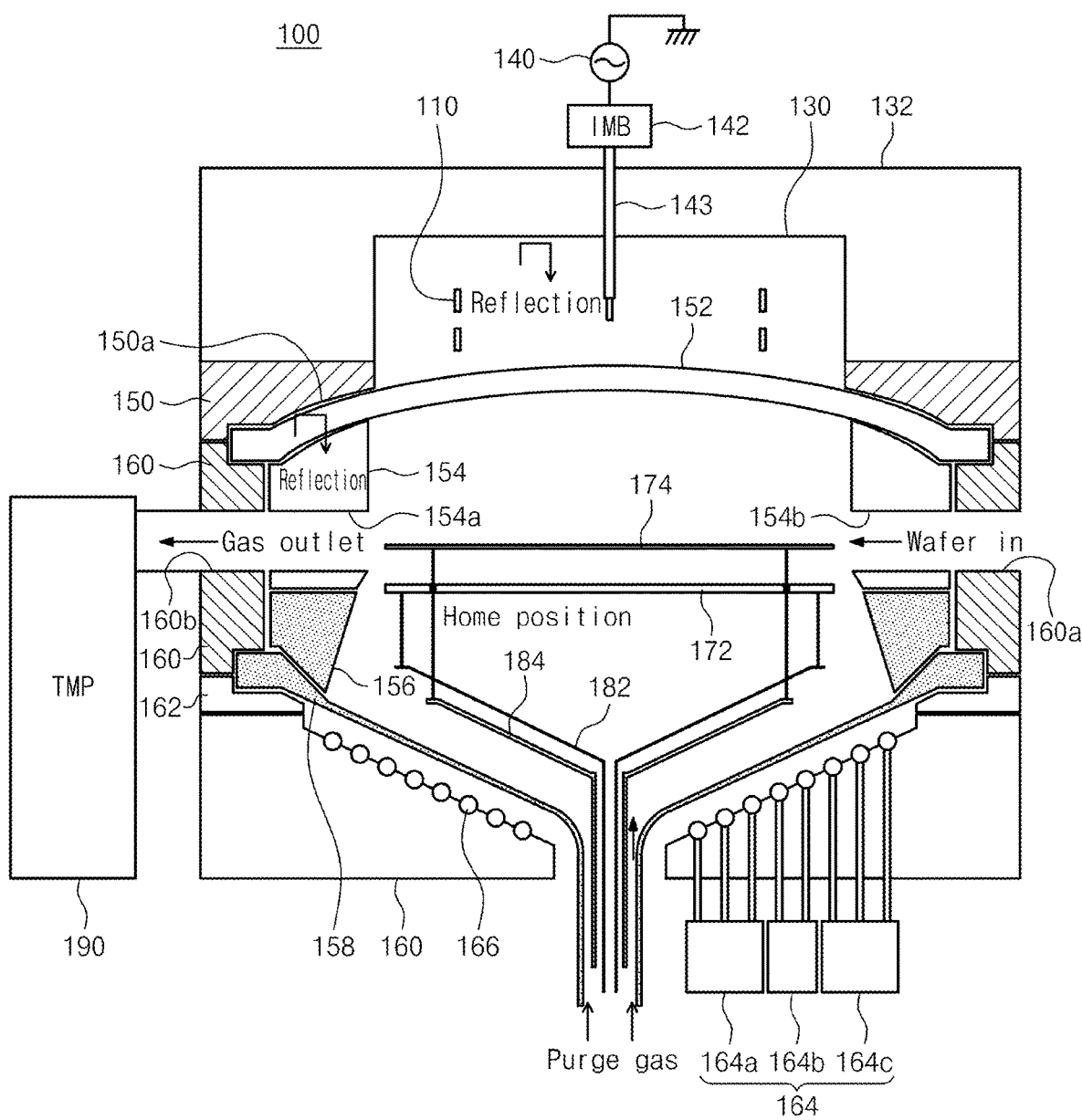
FIG. 1 is a conceptual diagram illustrating a home position in a plasma-enhanced chemical vapor deposition apparatus according to an example embodiment of the present disclosure.

The present disclosure provides a plasma-enhanced chemical vapor deposition apparatus including an antenna for inductively coupled plasma which has high transparency to infrared light emitted by a lamp heater, the antenna is not heated, and generates uniform inductively coupled plasma.

Conventionally, a high process temperature of about 900 degrees Celsius is required to grow a silicon-germanium single-crystalline or silicon single-crystalline layer on a substrate. In semiconductor fabrication using such a selective epitaxial growth, there is an advantage for easily fabricating a semiconductor device having a three-dimensional structure such as a FinFET which is difficult to be fabricated using a conventional flat plate technology.

When a lamp heater is applied for a process temperature of about 900 degrees Celsius, an antenna for generating inductively coupled plasma in a process container may be heated by the lamp heater to increase a temperature, and thus, a resistance value may be increased. Accordingly, the antenna may not efficiently generate inductively coupled plasma due to energy consumption caused by ohmic heating. In addition, the antenna may form a shadow for infrared light, reflected from an antenna housing, to provide temperature non-uniformity to the substrate.

Accordingly, there is a need for an antenna for inductively coupled plasma which is not heated by a lamp heater and does not form a shadow.

The antenna housing, disposed to surround the antenna, may reflect a portion of the infrared light emitted from the lamp heater, and the remainder of the infrared light may be absorbed to the antenna housing to heat the antenna, resulting in poor reliability. In the antenna housing, a spatially non-uniform temperature distribution may provide spatially non-uniform blackbody radiation. Accordingly, the antenna housing may use a separate resistive heater to be heated at uniform temperature and may provide spatially uniform blackbody radiation.

A conventional chemical vapor deposition apparatus, including an upper dome and a lower dome, injects process gas into the upper dome and exhausts the process gas from the upper dome. Accordingly, the gas may flow with a certain direction in the upper dome to reduce thin-film uniformity. The process gas, supplied from the upper dome, may flow into the lower dome to deposit an abnormal thin film on the lower dome.

According to the present disclosure, by supplying the purge gas to the lower dome and supplying the process gas to the upper dome, the process gas may be prevented from flowing into the lower dome to suppress deposition of an abnormal thin film on the lower dome. In addition, uniform plasma may be generated to form a uniform thin film without rotation of the substrate.

A conventional chemical vapor deposition apparatus, including an upper dome and a lower dome, uses a liner to prevent deposition of an unnecessary thin film on an inner wall of a chamber. The liner may be periodically replaced or cleaned.

In the present disclosure, a lower side of an upper liner and a lower liner may have inclined surfaces to inject purge gas, supplied from a lower dome, in a direction of an upper dome and to mount more lamp heaters. Since a gap between a susceptor and a substrate is maintained to be narrow, purge gas supplied from the lower dome may be injected toward the upper dome to cause a difference in pressure. Due to the narrow gap between the susceptor and the substrate, process gas injected into the upper dome stays only inside the upper dome to prevent contamination of the lower liner. The lower liner may be form of an opaque quartz material to scatter the infrared light of the lamp heater, and thus, uniform heating of the substrate may be provided.

In the present disclosure, an antenna for inductively coupled plasma may be disposed to be spaced apart from an upper dome, conducting wires constituting the antenna may be in the form of strip lines, and the strip lines may be vertically aligned in a width direction. Accordingly, infrared light incident in a direction of a lower dome may be minimally incident on the antenna. As a result, the antenna may suppress heating by the infrared light, and infrared light reflected from the antenna housing may heat a substrate while significantly reducing a shadow.

In the present disclosure, an antenna housing surrounding an antenna and shielding an electromagnetic wave may be plated by gold plating, so that infrared light may be reflected and be then incident on the substrate again. In addition, the antenna housing may have a cylindrical shape, rather than a dome shape, to reduce re-incident heating of the antenna caused by reflection of the infrared light.

In the present disclosure, a lamp heater disposed below the lower dome may be a ring-shaped lamp heater and may be provided as a plurality of lamp heaters. Ring-shaped lamp heaters may be grouped together to independently control power to uniformly heat a substrate.

In the present disclosure, a turbomolecular pump (TMP) connected to an exhaust portion of a chamber may allow base vacuum to be maintained inside the chamber, and may generate stable plasma at a pressure of several Torr or less even during a process.

Plasma-assisted chemical vapor deposition of the present disclosure may reduce performance degradation caused by infrared heating of an inductively coupled plasma antenna disposed on an upper dome and may provides infrared light, reflected from an antenna housing, back to a substrate to form a uniform thin film on the substrate at high speed.

Hereinafter, embodiments of the present disclosure will be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

FIG. 1 is a conceptual diagram illustrating a home position in a plasma-enhanced chemical vapor deposition apparatus according to an example embodiment of the present disclosure.

Figure 2:
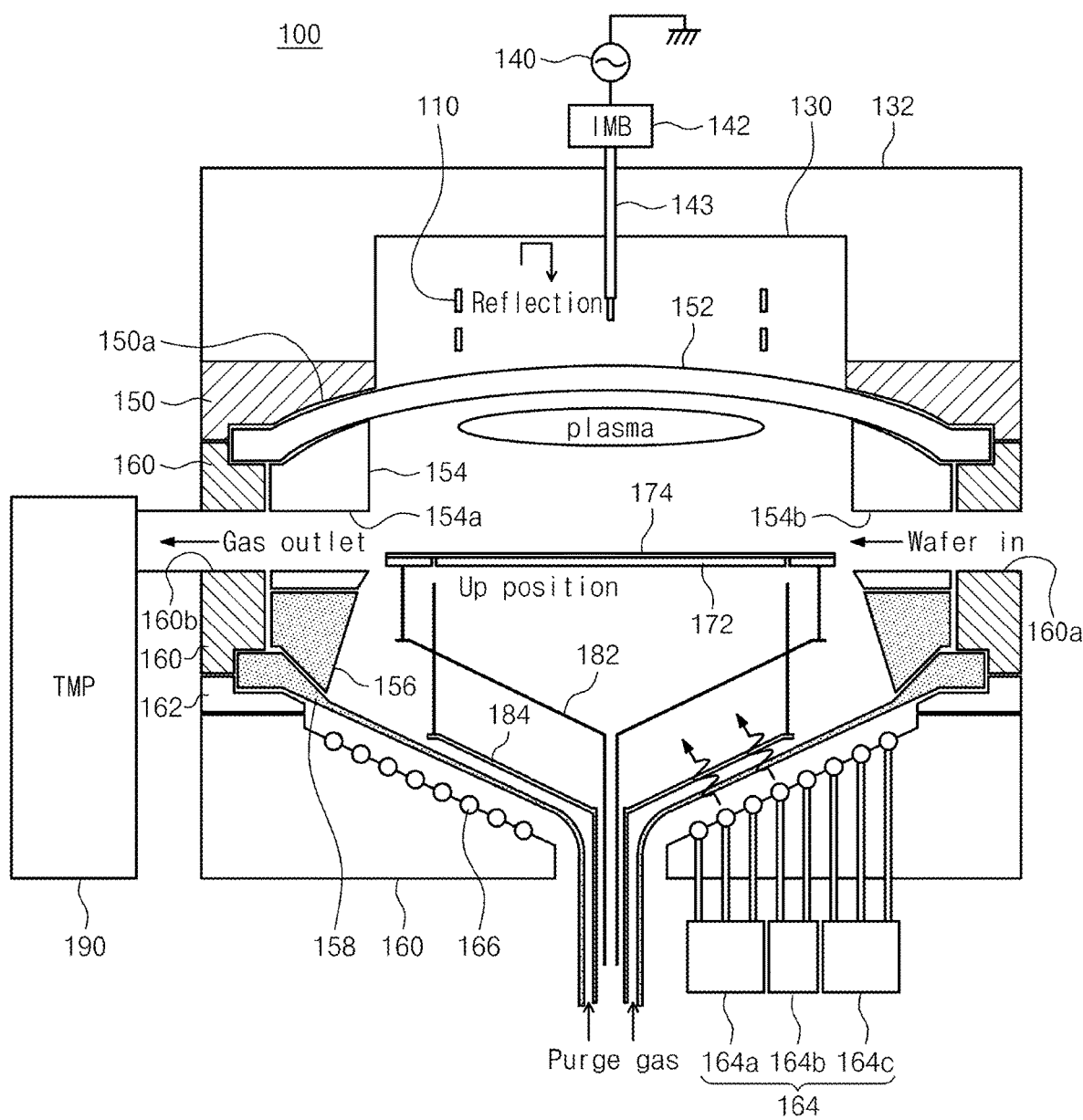
FIG. 2 is a conceptual diagram illustrating a lifting position in the plasma-enhanced chemical vapor deposition apparatus according to an example embodiment of the present disclosure.

FIG. 2 is a conceptual diagram illustrating a lifting position in the plasma-enhanced chemical vapor deposition apparatus according to an example embodiment of the present disclosure.

Figure 3:
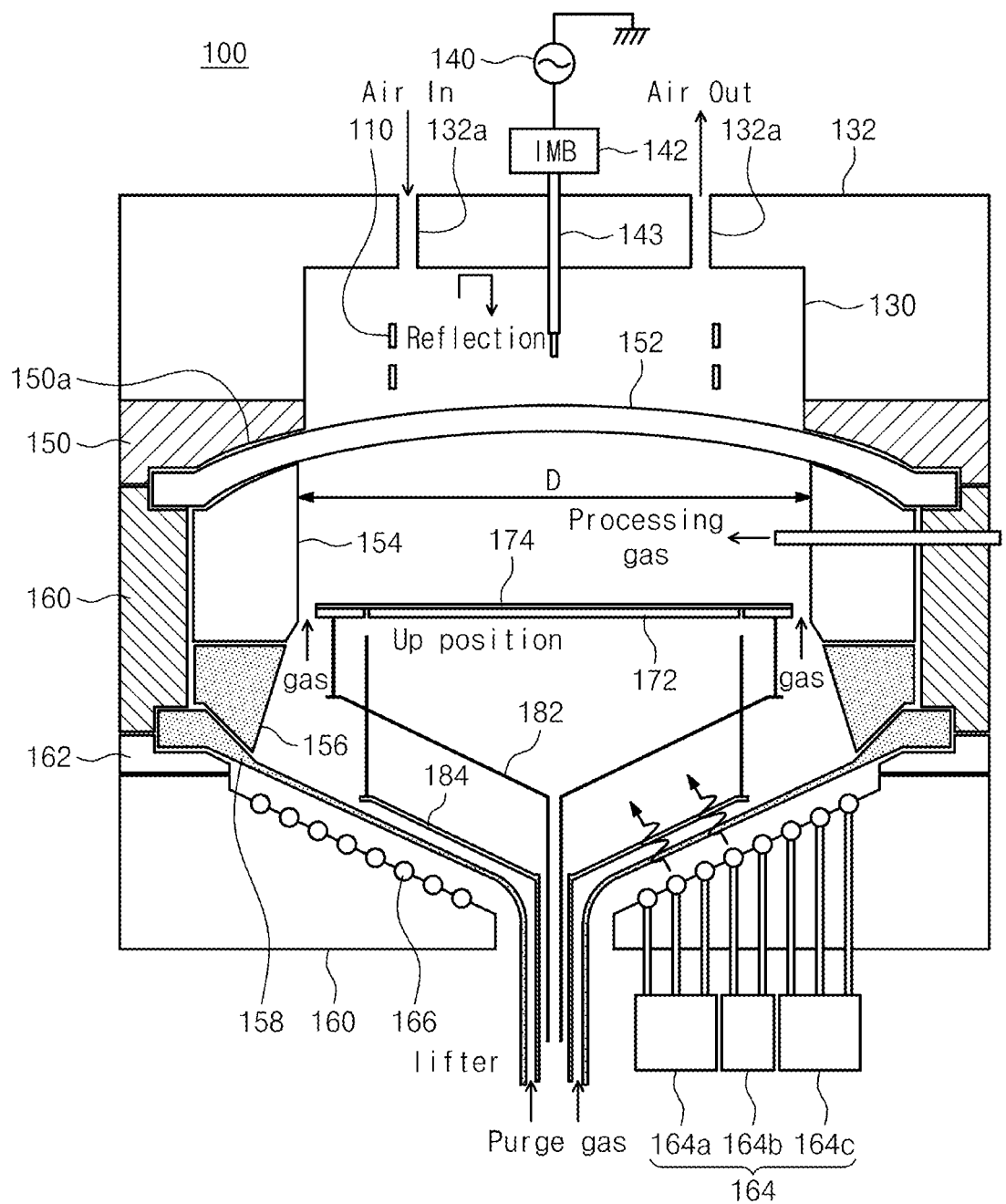
FIG. 3 is a conceptual diagram, taken in another direction, illustrating the plasma-enhanced chemical vapor deposition apparatus of FIG. 1.

FIG. 3 is a conceptual diagram, taken in another direction, illustrating the plasma-enhanced chemical vapor deposition apparatus of FIG. 1.

Figure 4:
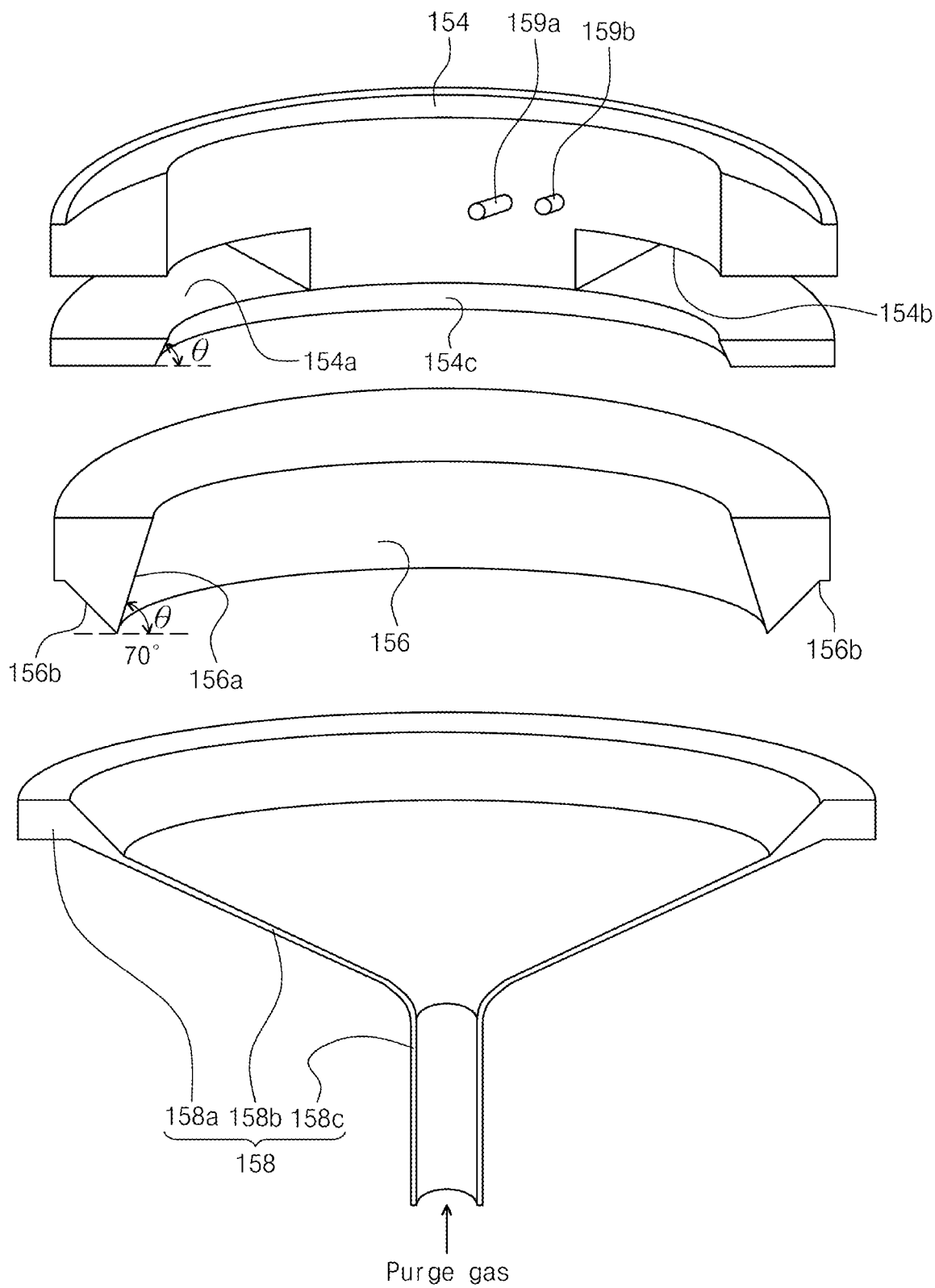
FIG. 4 is a cutaway perspective view illustrating an upper liner, a lower liner, and a lower dome of the plasma-enhanced chemical vapor deposition apparatus of FIG. 1.

FIG. 4 is a cutaway perspective view illustrating an upper liner, a lower liner, and a lower dome of the plasma-enhanced chemical vapor deposition apparatus of FIG. 1.

Figure 5:
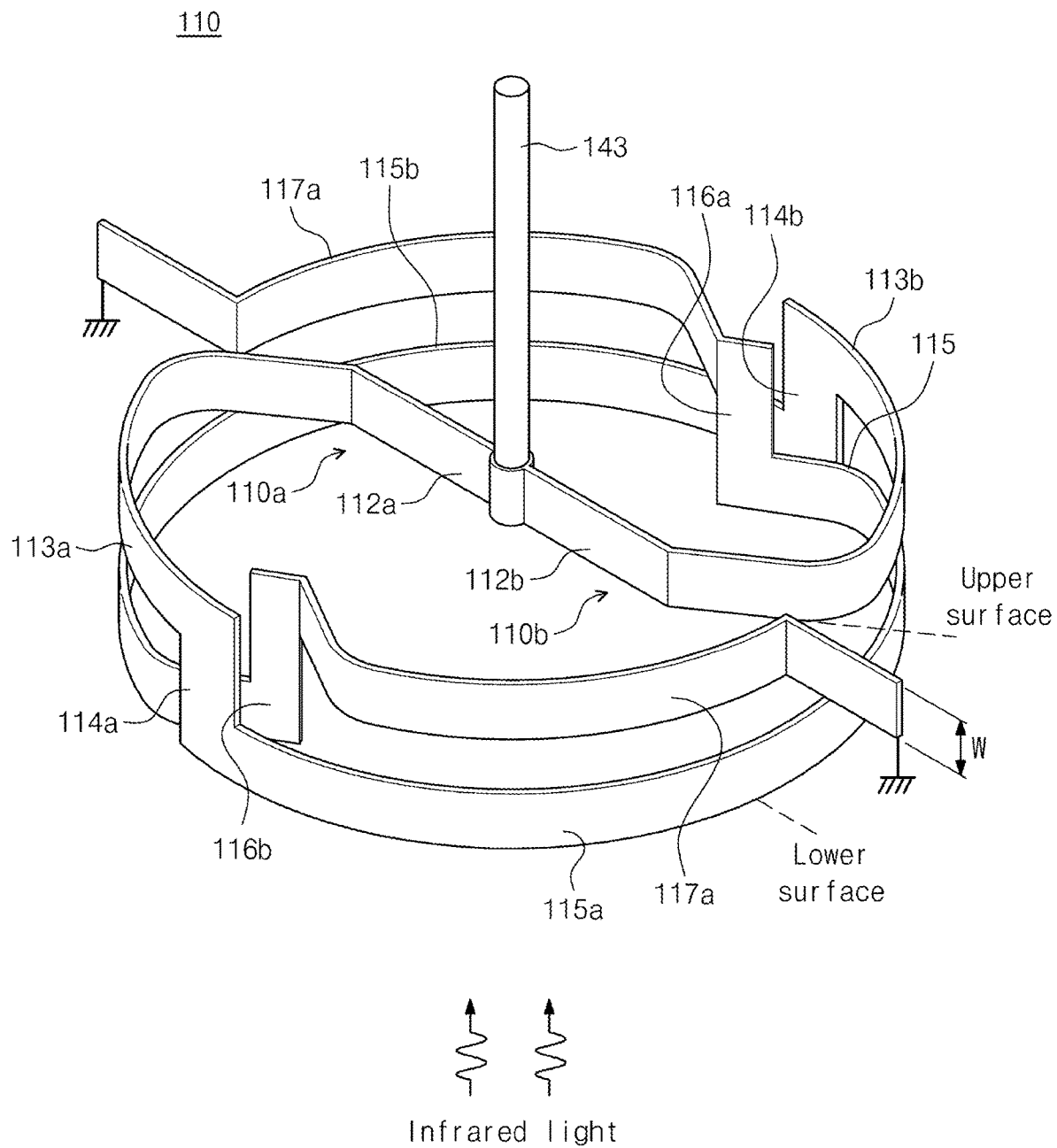
FIG. 5 is a perspective view illustrating the plasma-enhanced chemical vapor deposition apparatus of FIG. 1.

FIG. 5 is a perspective view illustrating the plasma-enhanced chemical vapor deposition apparatus of FIG. 1.

Figure 6:
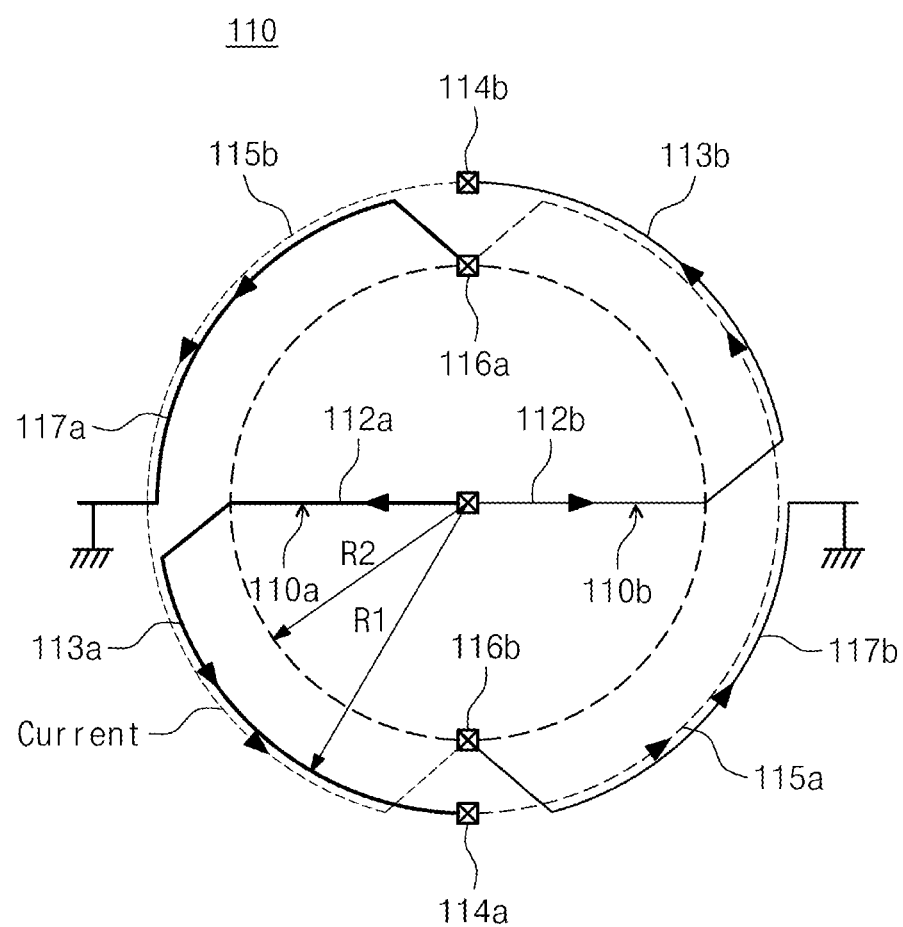
FIG. 6 is a plan view illustrating an antenna of FIG. 5.

FIG. 6 is a plan view illustrating an antenna of FIG. 5.

Referring to FIGS. 1 to 6, a plasma-enhanced chemical vapor deposition apparatus 100 according to an example embodiment may includes: a chamber 160 having a sidewall, a susceptor 172 mounting a substrate 174 inside the chamber 160, an upper dome 152 covering an upper surface of the chamber 160 and formed of a transparent dielectric material, and an antenna 110 disposed on the upper dome 152 to generate inductively coupled plasma. The antenna 110 may include two one-turn unit antennas. The two one-turn unit antennas each has an upper surface and a lower surface and are disposed to overlap each other on the upper surfaces and the lower surfaces of the two one-turn unit antennas the two one-turn unit antennas are connected in parallel and are connected to a radio-frequency (RF) power supply 140, and a width direction of each of the one-turn unit antennas stands upright vertically.

The chamber 160 may be formed of a conductive material, an internal space of the chamber 160 may have a cylindrical shape, and an external shape of the chamber 160 may be a cuboidal shape. The chamber 160 may be cooled by cooling water. The chamber 160, the upper dome 152, and the lower dome 158 may be coupled to each other to provide an enclosed space. The chamber 160 may include a substrate entrance 160a, formed on a side surface of the chamber 160, and an exhaust port 160b formed on a side surface facing the substrate entrance 160a. The exhaust port 160b may be connected to a high vacuum pump 190. The high vacuum pump 190 may be a turbomolecular pump. The high vacuum pump 190 may be maintained at a low base pressure, and may be maintained at a pressure of several Torr or less even during a process. An upper surface of the exhaust port 160b may be disposed on the same level as or a lower level than an upper surface of the substrate entrance 160a.

For example, when the upper surface of the exhaust port 160b is disposed on the same level as the upper surface of the substrate entrance 160a, an upper surface of the susceptor 172 may be changed to a position higher than lower surfaces of the exhaust port 160b and the substrate entrance 160a during a process. Thus, symmetry inside the chamber 160 may be improved, and a flow of process gas may be improved to provide uniform thin film deposition.

The susceptor 172 may mount the substrate 174 when the substrate 174 is introduced through the substrate entrance 160a formed on the side surface of the chamber 160. The susceptor 172 may have the same plate shape as the substrate 174, and may be formed of a metal or graphite having excellent thermal conductivity. The susceptor 172 may be heated by infrared light, and the substrate 174 may be heated by heat transfer. During a process, an upper surface of the susceptor 172 may be higher than lower surfaces of the exhaust port 160b and the substrate entrance 160a. The susceptor 172 may rotate.

A first lifter 184 may extend along a central axis of the lower dome 158, and may include a first lifter body having a tripod shape and a first lift pin. The first lifter 184 and a second lifter 182 may have a coaxial structure. When the substrate 174 is transferred into the chamber 160, the first lifter 184 may be lifted from an accommodation position or a home position to support the substrate 174. Then, the first lifter 184 may be lowered to place the substrate 174 on the susceptor 172. A material of the first lifter 184 may be quartz or a metal. The first lifter 184 may be vertically moved by a driving shaft.

The second lifter 182 may extend along the central axis of the lower dome 158, and may include a second lifter body having a tripod shape and a second lift pin. The second lifter 182 may lift the susceptor 172, on which the substrate 174 is mounted, to a process position or a lifted position. The process position may be disposed in the same plane as an upper surface of a second opening 154b for introducing the substrate 174 in the upper liner 154. In addition, the process position may be disposed in substantially the same plane as a lower surface of a first opening 154a for exhausting gas in the upper liner 154. Accordingly, a gap between the susceptor 172 and the upper liner 154 may be significantly reduced in the process position. A material of the second lifter 182 may be quartz or a metal. The second lifter 182 may be vertically moved by a driving shaft.

The upper dome 152 may be quartz or sapphire, as a transparent dielectric material. The upper dome 152 may be inserted into and coupled to a raised spot formed on the upper surface of the chamber 160. The upper dome 152 may have a washer shape in a coupling position coupled to the chamber 160 to provide vacuum sealing. The upper dome 152 may have an arc shape or an elliptical shape. The upper dome 152 may allow infrared light, incident from a lower portion, to pass therethrough. Infrared light, reflected from the antenna housing 130, may pass through the upper dome 152 to be incident on the substrate 174.

The lower dome 158 may be quartz or sapphire, as a transparent dielectric material. The lower dome 158 may have a funnel-shaped lower dome body 158b, a washer-shaped coupling portion 158a coupled to a raised spot formed on the lower surface of the chamber 160, and a cylindrical pipe 158c connected to a center of the lower dome body 158b. The lower dome 158 may be inserted into and coupled to the raised spot formed on the lower surface of the chamber 160. In the lower dome 158, the coupling portion 158a coupled to the chamber 160 to provide vacuum sealing may have a washer shape. The driving shaft of the first lifter and the driving shaft of the second lifter may be disposed to be inserted into the cylindrical pipe 158c. Purge gas, supplied through the lower dome 158, may be supplied through a flow path. The flow path may be a cylindrical pipe 158c. The purge gas may be inert gas such as argon (Ar).

The upper liner 154 may be a transparent dielectric material. The upper liner 154 may be quartz, alumina, sapphire, or aluminum nitride. A material of the upper liner 154 may be selected as a material suppressing deposition of an abnormal thin film. When the upper liner 154 is contaminated, it may be disassembled and cleaned. The upper liner 154 may have an overall ring shape, and an upper surface thereof may be a curved surface having the shape of the upper dome 152. The upper liner 154 may include a first opening 154a, formed on one side of the upper liner 154 to exhaust gas, and a second opening 154b formed on a side surface of the upper liner 154 to provide a path of a substrate to the other side facing the first opening 154a. The first opening 154a may be aligned with the exhaust port 160b, and the second opening 154b may be aligned with the substrate entrance 160a. An internal side surface of the upper liner 154 may extend vertically, and may be connected to a tapered portion 154c tapered from a lower surface of the first opening 154a. A tapered internal side surface may have the same inclination as the internal side surface of the lower liner 156. The angle of inclination θ of the inclined surface may be about 70 degrees. Accordingly, the purge gas may be stably supplied to an upper region of the chamber 160.

The upper liner 154 may include one or more process gas supply parts 159a and 159b supplying a process gas through a side surface of the upper liner 154. The process gas supply parts 159a and 159b may protrude from the side surface of the upper liner 154. For example, the process gas supply parts 159a and 159b may include a first process gas supply part 159a, supplying a first process gas such as $SiH_4$, and a second process gas supply part 159b supplying a second process gas.

The first process gas supply portion 159a may protrude more from the side surface of the upper liner 154 such that first process gas such as $SiH_4$ is exposed to plasma. Meanwhile, the second process gas supply part 159b may protrude less from the side surface of the upper liner such that second process gas such as $H_2$ is less exposed to the plasma. Since the purge gas is introduced into the upper region of the chamber 160 from the lower dome 158, the purge gas may be uniformly supplied on a circumference to have a spatially uniform pressure distribution.

The lower liner 156 may be coupled to the upper liner 154. The lower liner 156 may be disposed inside the chamber 160, may surround an internal circumferential surface of an upper edge of the lower dome 158, and may have a ring shape formed of an opaque dielectric material. The upper liner 154 may be disposed on the lower liner 156, and may be aligned with the lower liner 156 to be coupled thereto. The lower liner 156 may include an inclined lower external surface 156b for being coupling to the lower dome 158 and an inclined lower internal surface 156a for maintaining a continuous inclination with respect to the upper liner 154. The lower liner 156 may be formed of an opaque material such as quartz. That is, the lower liner 156 may have an internal circumferential surface facing the space of the lower dome, and the internal circumferential surface of the lower liner 156 may have an inclination by which a thickness thereof is increased in a vertical direction toward the upper region from the lower region of the chamber 160. An angle of inclination θ of the internal circumferential surface may be about 70 degrees. The inclined internal circumferential surface may expose a lamp heater, disposed on an uppermost portion, to provide more uniform heating, and may scatter incident infrared light to suppress heating of the chamber 160.

A heat insulating part 162 may be disposed between the lower surface of the chamber 160 and a reflector 160, and may have a ring shape. The heat insulating part 162 may reduce heat transfer of the chamber 160 from the heated reflector 160. The heat insulating part 162 may be formed of a ceramic material. The upper surface of the heat insulating part 162 may be provided with a raised spot. The raised spot of the heat insulating part 162 and the raised spot of the lower surface of the chamber 160 may accommodate and vacuum-seal the washer-shaped coupling portion 158a of the lower dome 158.

A concentric lamp heater 166 may include a plurality of concentric ring-shaped lamp heaters 166, and may be connected to a power supply 164. The concentric ring-shaped lamp heaters 166 may be arranged at regular intervals along the inclined surface of the lower dome 158, and may be divided into three groups to independently receive power. The concentric ring-shaped lamp heater 166 may be inserted into a ring-shaped groove, formed on an inclined surface of the reflector 160, to be aligned. For example, the concentric ring-shaped lamp heater 166 may be a halogen lamp heater, and eight concentric ring-shaped lamp heaters 166 may be provided. Lower three lamp heaters may constitute a first group, intermediate two lamp heaters may constitute a second group, and upper three lamp heaters may constitute a third group. The first group may be connected to a first power supply 164a, the second group may be connected to a second power supply 164b, and the third group may be connected to a third power supply 164c. The first to third power supplies 164a to 164c may be independently controlled to uniformly heating the substrate.

The reflector 160 may support a lower surface of the heat insulating part 162, and may mount the lamp heater 166. The inclined surface, on which the lamp heater 166 is mounted, may have a conic shape to be maintained at a predetermined distance from the inclined surface of the lower dome 158. The reflector 160 may be formed of a conductive material, and may be cooled by cooling water.

A clamp 150 may be disposed to cover an edge of the upper dome 152. The clamp 150 may be formed of a conductive material, and may be cooled by cooling water. A lower surface of the clamp 150 may be provided with a raised spot to be coupled to the washer-shaped coupling portion of the upper dome 152, and a curved portion 150a to cover a portion of the curved portion of the upper dome 152. The curved portion 150a of the clamp 150 may be plated with gold to reflect infrared light. An internal diameter of the clamp 150 may be substantially the same as an internal diameter D of the upper liner 154. In addition, the internal diameter of the clamp 150 may be the same as a diameter of the antenna housing 130.

The antenna 110 may include two one-turn unit antennas 110a and 110b. The antennas 110 may be disposed to overlap each other on an upper surface and a lower surface, the one-turn unit antenna may be in the form of a strip line having a width greater than a thickness, and a width direction of the one-turn antenna may stand upright vertically. The two one-turn unit antennas may be connected in parallel and are connected to the RF power supply 140. The RF power supply 140 may supply RF power to the antenna 110 through an impedance matching box 142 and a power supply line 143. The antenna 110 may include two one-turn unit antennas, the two one-turn unit antennas may be disposed to overlap each other on an upper surface and a lower surface, and the two one-turn unit antennas may be connected in parallel and are connected to an RF power supply, and a width direction of the one-turn unit antenna may stand upright vertically.

An antenna, through which RF current flows, should have a sufficient cross-sectional area for high current, and a closed loop should be formed to generate sufficient magnetic flux. In addition, a plurality of turns is required to secure sufficient magnetic flux or high inductance. Therefore, a stack structure is required. However, since an antenna having a width standing upright occupies a large space and is disadvantageous in securing sufficient magnetic, the antenna is not conventionally used.

In the present disclosure, the antenna 110 may use a vertically standing strip line such that ultraviolet light, incident from an upper portion or a lower portion of a chamber, is absorbed to significantly reduce an increase in resistance caused by heating. The antenna 110 may provide high light transmittance with respect to infrared light.

In addition, an antenna may be coated with gold (Au) or silver (Ag) to increase infrared reflection. In addition, an antenna having a two-layer structure is used to secure sufficient magnetic flux. In the one-turn unit antenna, a position supplied with RF power may be disposed on an upper surface to reduce power loss caused by capacitive coupling. An aspect ratio (a ratio of width W to thickness t (W/t)) of the strip line may be 10 or more. The strip line may have a thickness of several millimeters and a width of several centimeters. Since the standing strip line structure does not impede a flow formed by introduction of air, the standing strip line structure may provide smooth air cooling. In addition, the infrared light reflected from the antenna housing may significantly reduce a shadow formed by the antenna.

The lower surface of the antenna 110 may be substantially the same plane as an upper surface of the clamp 150, and may be higher than a highest position of the upper dome 152. Accordingly, the antenna 110 is not in direct contact with the upper dome 152, so that the upper dome 152 may not be directly heated by heat transfer. The two one-turn unit antennas 110a and 110b may be rotated 180 degrees to overlap each other. Each of the one-turn unit antennas 110a and 110b may be disposed on the lower surface in a predetermined section and disposed on the upper surface in the other sections.

The one-turn unit antenna 110a/110b may include a radial portion 112a/112b extending from the upper surface in a radial direction from a center of the one-turn antenna; a first curved portion 113a/113b extending from the upper surface by rotating 90 degrees clockwise along a circumference having a first radius R1 in the radial portion; a first vertical extension portion 114a/114b changing an arrangement plane from the upper surface to the lower surface in the first curved portion; a second curved portion 115a/115b rotating 180 degrees clockwise along the circumference having the first radius R1 in the first vertical extension portion; a second vertical extension portion 116a/116b continuously connected to the second curved portion, changing a radius from the first radius R1 to a second radius R2 smaller than the first radius R1, changing an arrangement plane from the lower surface to the upper surface, and changing a radius from the second radius R2 to the first radius R1; and a third curved portion 117a/117b extending from the upper surface by rotating 90 degrees clockwise along the circumference having the first radius R1 from the second vertical extension portion. The third curved portions 117a and 117b may be connected to a ground portion extending in the radial direction.

The antenna housing 130 may be disposed to surround the antenna 110, and an internal surface of the antenna housing 130 may be coated with gold (Au). The antenna housing 130 may shield electromagnetic waves radiated from the antenna 110 and may reflect infrared light radiated from the lamp heater 166.

A chamber housing 132 may be disposed on the clamp 150 and may be disposed to cover the antenna housing 130. The chamber housing 132 may be disposed to surround the antenna housing 130. The chamber housing 132 may include a flow path 132a for injecting air into the antenna housing 130 and exhausting air from the antenna housing 130. The air, injected into the antenna housing 130, may cool the antenna 110 and the upper dome 152.

Figure 7:
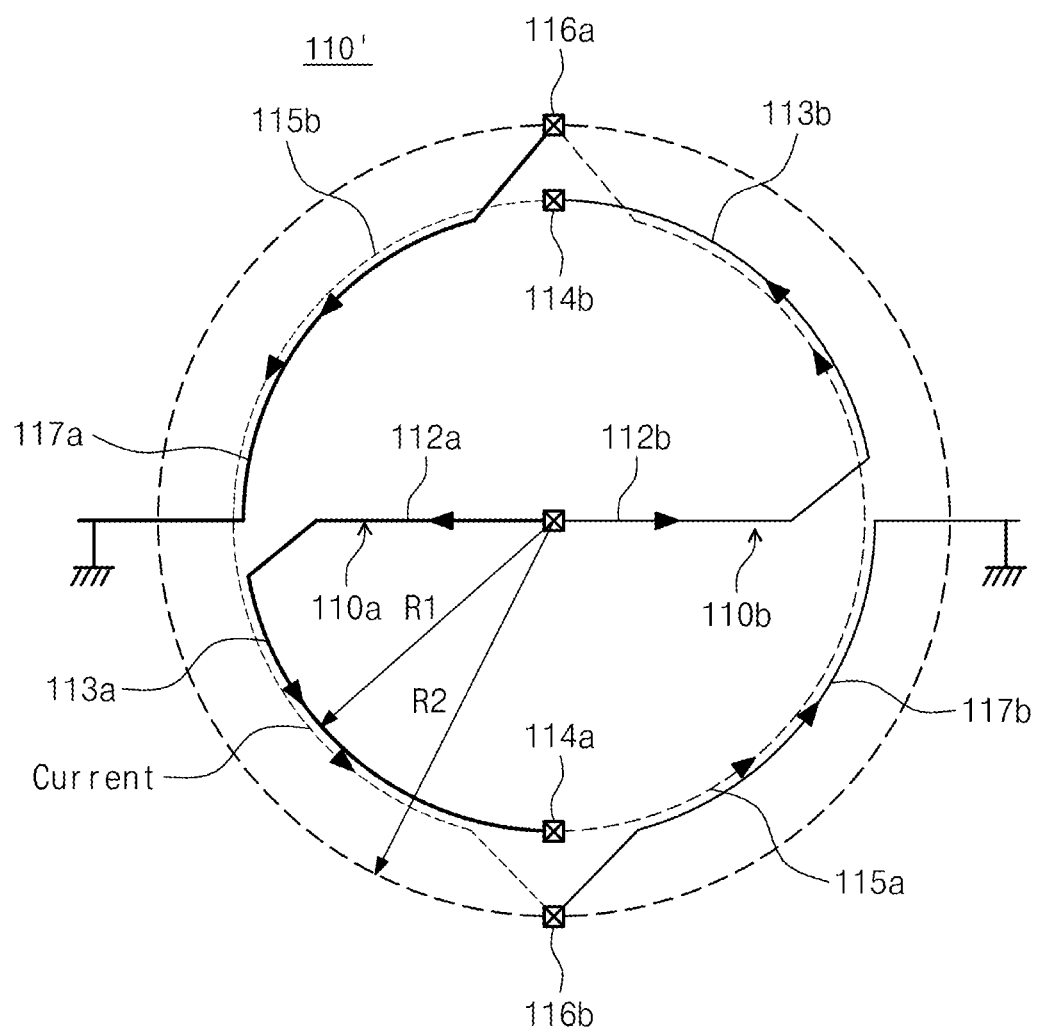
FIG. 7 is a plan view illustrating an antenna according to another example embodiment of the present disclosure.

FIG. 7 is a plan view illustrating an antenna according to another example embodiment of the present disclosure.

Referring to FIG. 7, an antenna 100' may include two one-turn unit antennas 110a and 110b. The one-turn unit antennas 110a/110b may include a radial portion 112a/112b extending from an upper surface in a radial direction from a center of the one-turn unit antenna; a first curved portion 113a/113b extending from the upper surface by rotating 90 degrees clockwise along a circumference having a first radius R1 in the radial portion; a first vertical extension portion 114a/114b changing an arrangement plane from the upper surface to a lower surface in the first curved portion; a second curved portion 115a/115b rotating 180 degrees clockwise along the circumference having the first radius R1 in the first vertical extension portion; a second vertical extension portion 116a/116b continuously connected to the second curved portion 115a/115b, changing a radius from the first radius R1 to a second radius R2 greater than the first radius R1, changing the arrangement plane from the lower surface to the upper surface, and changing a radius from the second radius R2 to the first radius R1; and a third curved portion 117a/117b extending from the upper surface by rotating 90 degrees clockwise along the circumference having the first radius R1 from the second vertical extension portion 116a/116b. The third curved portion 117a/117b may be connected to a ground portion extending in the radial direction.

Figure 8:
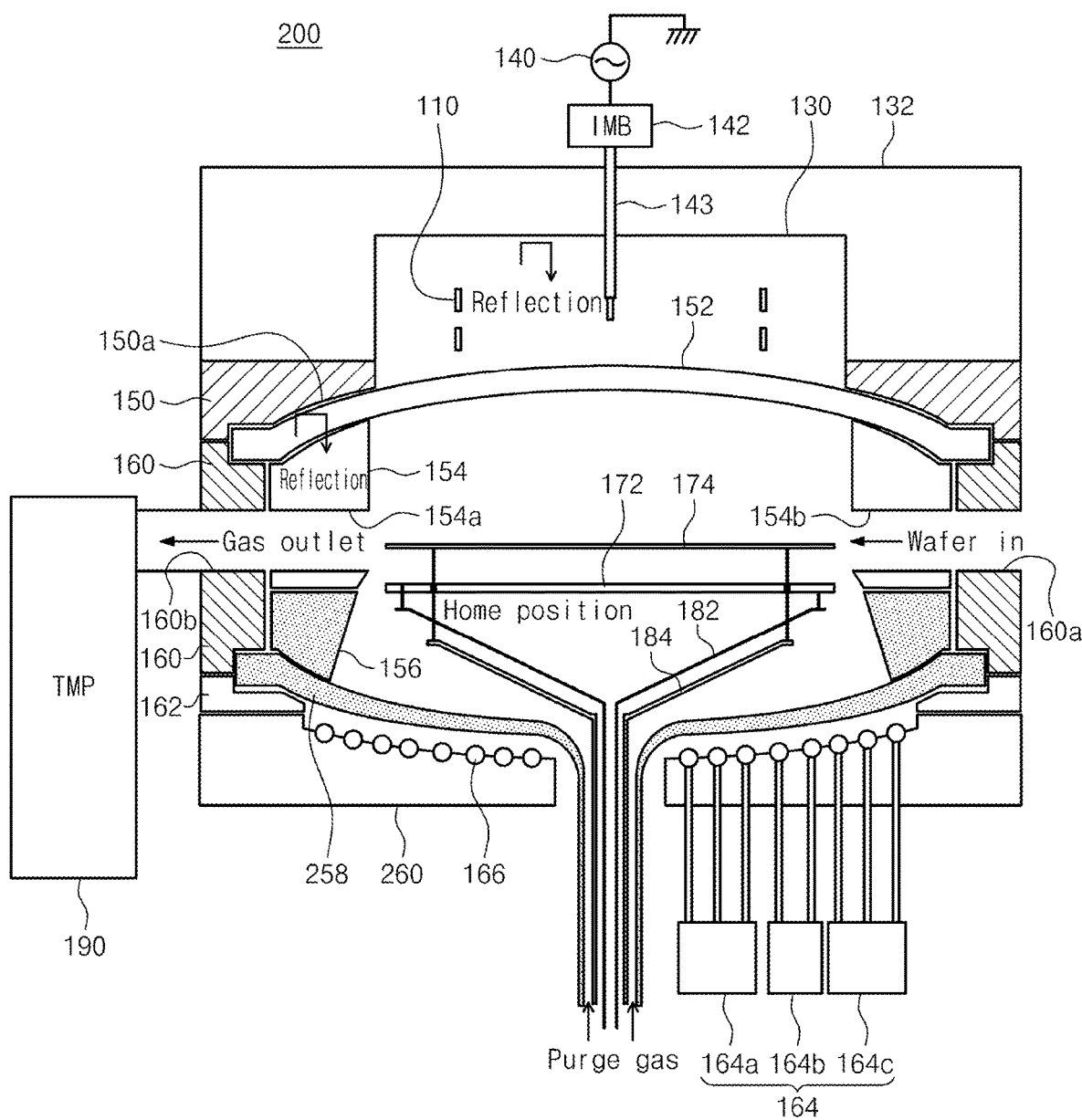
FIG. 8 is a conceptual diagram illustrating a plasma-enhanced chemical vapor deposition apparatus according to another example embodiment of the present disclosure.

FIG. 8 is a conceptual diagram illustrating a plasma-enhanced chemical vapor deposition apparatus according to another example embodiment.

Referring to FIG. 8, a plasma-enhanced chemical vapor deposition apparatus 200 according to an example embodiment may include a chamber 160 having a sidewall, a susceptor 172 mounting a substrate 174 inside the chamber 160, an upper dome 152 covering an upper surface of the chamber 160 and formed of a transparent dielectric material;

and an antenna 110 disposed on the upper dome 152 to generate inductively coupled plasma. The antenna 110 may include two one-turn unit antennas, the two one-turn unit antennas each has an upper surface and a lower surface and are disposed to overlap each other on the upper surfaces and the lower surfaces of the two one-turn unit antennas, and the two one-turn unit antennas may be connected to each other in parallel and are connected to a radio-frequency (RF) power supply 140, and a width direction of each of the one-turn unit antennas may stand upright vertically.

A lower dome 258 may cover a lower surface of the chamber 160, may be formed of a transparent dielectric material, and may have the same curvature as the upper dome 152. A lamp heater may be disposed on a lower surface of the lower dome 258. A reflector 260 may be disposed on a lower surface of the lamp heater.

Figure 9:
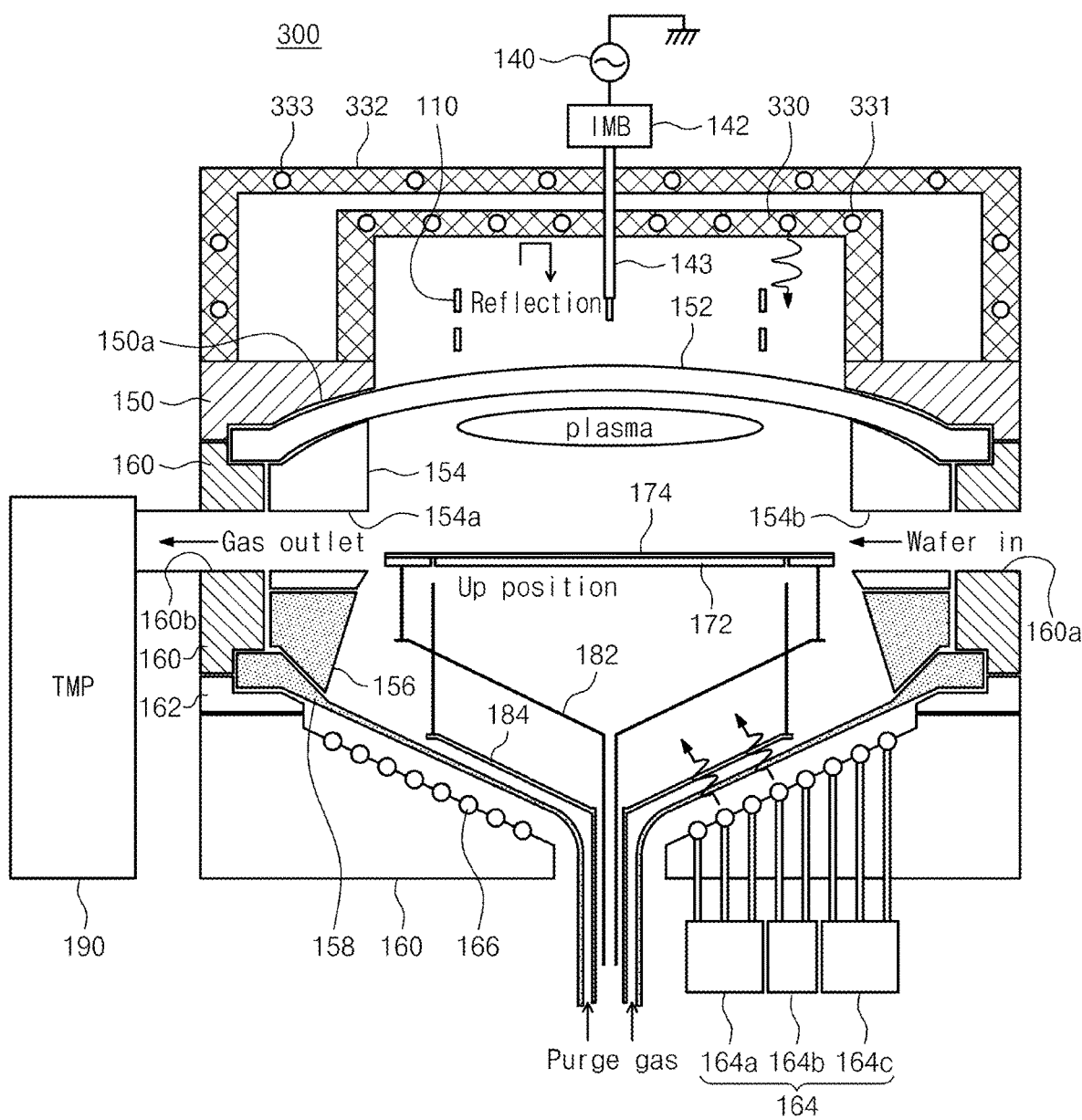
FIG. 9 is a conceptual diagram illustrating a plasma-enhanced chemical vapor deposition apparatus according to another example embodiment of the present disclosure.

FIG. 9 is a conceptual diagram illustrating a plasma-enhanced chemical vapor deposition apparatus according to another example embodiment.

Referring to FIG. 9, a plasma-enhanced chemical vapor deposition apparatus 300 according to an example embodiment may include a chamber 160 having a sidewall, a susceptor 172 mounting a substrate 174 inside the chamber 160, an upper dome 152 covering an upper surface of the chamber 160 and formed of a transparent dielectric material, and an antenna 110 disposed on the upper dome 152 to generate an inductively coupled plasma. The antenna 110 may include two one-turn unit antennas, the two one-turn unit antennas may be disposed to overlap each other on an upper surface and a lower surface, and the two one-turn unit antennas may be connected in parallel and are connected to a radio-frequency (RF) power supply 140, and a width direction of the one-turn unit antenna may stand upright vertically.

An antenna housing 330 may be disposed to surround the antenna 110, and an internal surface of the antenna housing 330 may be coated with gold (Au). The antenna housing 330 may be formed of a conductive material, having high reflectivity to an infrared band, such as a metal. Specifically, the antenna housing 330 may be in the form of a cylinder having a lid and may be formed of aluminum.

The antenna housing 330 may be disposed on the clamp 150, may shield electromagnetic waves radiated from the antenna 110, may reflect infrared light radiated from the lamp heater 166, and may absorb the infrared light of the lamp heater 166 to be non-uniformly heated. A separate heater 331 may heat the antenna housing 330 to spatially uniformly heat the antenna housing 330. The heater 331 may be a resistive heater embedded in the antenna housing 330. The resistive heater may be embedded in a lid of the antenna housing 330 in a spiral form. For a spatially uniform temperature distribution, a gap between heaters may be reduced in a radial direction. The uniformly heated antenna housing 330 may additionally heat the substrate 174 through blackbody radiation. The heated antenna housing 330 may not provide a temperature difference depending on an environment.

The temperature of the antenna housing 330 may be higher than a temperature which may be increased by the lamp heater 166. For example, the temperature of the antenna housing 330 may range from 200 degrees Celsius to 600 degrees Celsius.

The antenna 110 may be additionally heated by the heated antenna housing 330. However, the antenna 110 may absorb a less amount of radiant heat without impeding a flow formed by introduction of air, and may be cooled by a smooth flow of the air.

The chamber housing 332 may be disposed on the clamp 150 and may be disposed to cover the antenna housing 330. A space may be provided between the chamber housing 332 and the antenna housing 330 to reduce heat loss caused by heat transfer. The space may be in an atmospheric pressure state, and air filling the space may not be circulated.

The chamber housing 332 may include a flow path 333 through which a refrigerant flows, and may be cooled to room temperature. The chamber housing 332 may be in the form of a cylinder having a lid, and may be formed of a conductive material.

An air flow path may pass through the chamber housing 332 and the antenna housing 330 to inject air into a space defined by the antenna housing 330. The air, injected into the antenna housing 330, may cool the antenna 110 to provide a stable operation.

Figure 10:
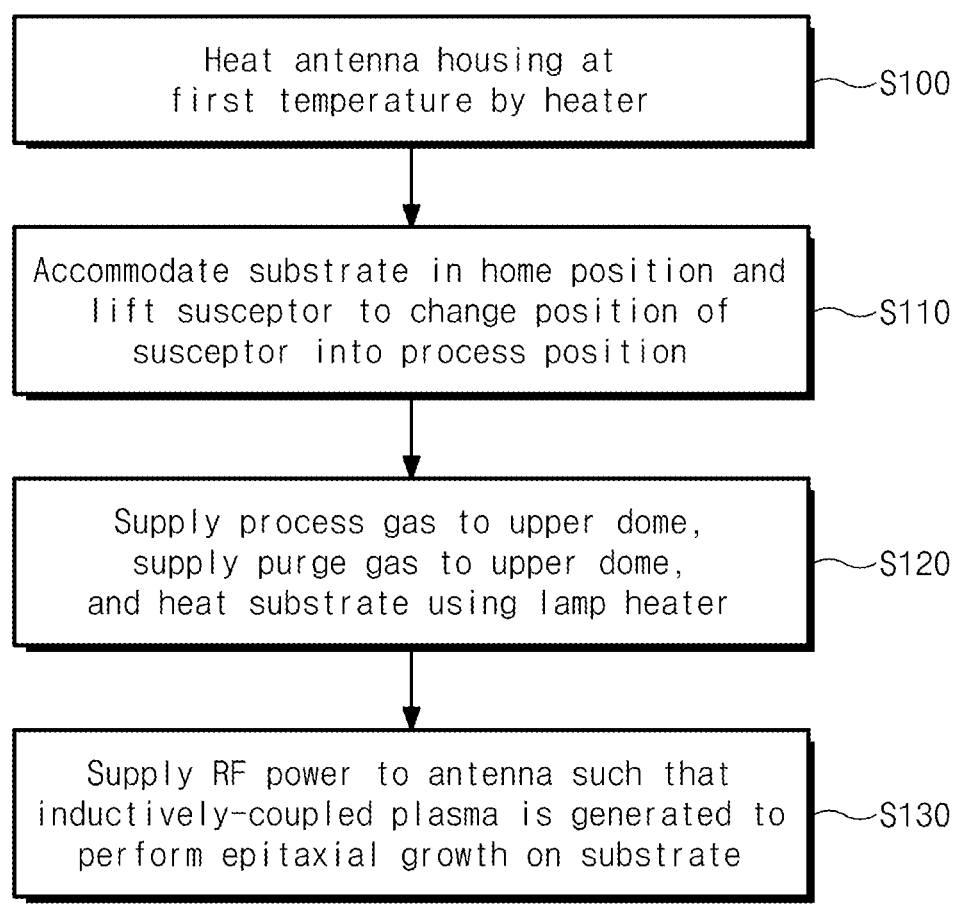
FIG. 10 is a flowchart illustrating a method of operating a substrate processing apparatus according to an example embodiment of the present disclosure.

FIG. 10 is a flowchart illustrating a method of operating a substrate processing apparatus according to an example embodiment.

Referring to FIG. 10, a plasma-enhanced chemical vapor deposition apparatus 300 (may also be referred as a substrate processing apparatus) may include: a chamber 160 having a sidewall; a susceptor 172 mounting a substrate 174 inside the chamber 160; an upper dome 152 covering an upper surface of the chamber 160 and formed of a transparent dielectric material; an antenna 110 disposed on the upper dome 152 to generate inductively coupled plasma; a lower dome 158 covering a lower surface of the chamber 160 and formed of a transparent dielectric material; an upper liner 154 disposed on an internal side of the chamber 160 to surround a lower side edge of the upper dome 152 and formed of a dielectric material; a lower liner 156 disposed on an internal side of the chamber 160 to surround an upper edge internal circumferential surface of the lower dome 158 and formed of a dielectric material; a lamp heater 166 disposed below the lower dome 158; and an antenna housing 330 disposed to cover the antenna 110 and heated by a heater 331.

The method of operating the plasma-enhanced chemical vapor deposition apparatus 300 may start with an operation S100 in which the antenna housing 330 is heated to a first temperature by the heater 331. The first temperature may range from 200 degrees Celsius to 600 degrees Celsius.

The substrate 174 may be accommodated in a home position of the susceptor 172, and the susceptor 172 may be lifted to change a position of the substrate to a process position (operation S110). The process position may be disposed in the same plane as an upper surface of a second opening 154b for introducing the substrate 174 into the upper liner 154. In addition, the process position may be disposed in substantially the same plane as a lower surface of a first opening 154a for exhausting gas in the upper liner 154. Accordingly, a gap between the susceptor 172 and the upper liner 154 may be significantly reduced in the process position. The gap between the susceptor 172 and the upper liner 154 may be significantly reduced in the process location.

A process gas may be supplied to the upper dome 152, a purge gas may be supplied to the lower dome 158, and the substrate 174 may be heated using the lamp heater 166 (operation S120). A temperature of the substrate 174 may range from 550 degrees Celsius to 950 degrees Celsius.

By supplying radio-frequency (RF) power to the antenna 110, inductively coupled plasma may be generated to perform epitaxial growth on the substrate 174 (operation S130). The epitaxial growth may be silicon single crystal.

As described above, a substrate processing apparatus according to an example embodiment of the present disclosure may stably generate plasma even in a high-temperature process using a lamp heater to perform selective epitaxial deposition.

Although the present disclosure and its advantages have been described in detail, it should be understood that various changes, substitutions and alterations can be made herein without departing from the spirit and scope of the disclosure as defined by the following claims.

What is claimed is:

1. A substrate processing apparatus comprising:
a chamber having a sidewall;
a susceptor mounting a substrate inside the chamber;
an upper dome covering an upper surface of the chamber and formed of a transparent dielectric material; and
an antenna disposed on the upper dome to generate inductively coupled plasma,
wherein the antenna includes two one-turn unit antennas,
the two one-turn unit antennas each has an upper surface and a lower surface and are disposed to overlap each other on the upper surfaces and the lower surfaces of the two one-turn unit antennas,
the two one-turn unit antennas are connected in parallel and are connected to a radio-frequency (RF) power supply, and
a width direction of each of the one-turn unit antennas stands upright vertically.

2. The substrate processing apparatus of claim 1, further comprising:
a funnel-shaped lower dome covering a lower surface of the chamber and formed of a transparent dielectric material;
a concentric lamp heater disposed on a lower surface of the lower dome;
a ring-shaped upper liner disposed on an internal side of the chamber to surround a lower side edge of the upper dome and formed of a dielectric material;
a ring-shaped lower liner disposed on an internal side of the chamber to surround an upper edge internal circumferential surface of the lower dome and formed of a dielectric material; and
a reflector disposed on a lower surface of the concentric lamp heater.

3. The substrate processing apparatus of claim 1, wherein each of the one-turn unit antenna is in the form of a strip line having a width greater than a thickness, and a ratio of the width W to the thickness t (W/t) is 10 or more.

4. The substrate processing apparatus of claim 1, wherein in one of the two one-turn unit antennas, the one-turn unit antenna comprises:
a radial portion extending from the upper surface of the one-turn unit antenna in a radial direction from a center of the one-turn unit antenna;
a first curved portion extending from the upper surface of the one-turn unit antenna by rotating 90 degrees clockwise along a circumference having a first radius in the radial portion;
a first vertical extension portion changing an arrangement plane from the upper surface of the one-turn unit antenna to the lower surface of the one-turn unit antenna in the first curved portion;
a second curved rotating 180 degrees clockwise along the circumference having the first radius in the first vertical extension portion;
a second vertical extension portion continuously connected to the second curved portion, changing a radius from the first radius to a second radius smaller than the first radius, changing an arrangement plane from the lower surface of the one-turn unit antenna to the upper surface of the one-turn unit antenna, and changing a radius from the second radius to the first radius; and a third curved portion extending from the upper surface of the one-turn unit antenna by rotating 90 degrees clockwise along the circumference having the first radius from the second vertical extension portion.

5. The substrate processing apparatus of claim 1, further comprising: an antenna housing disposed to surround the antenna and coated with a reflector.

6. The substrate processing apparatus of claim 1, further comprising:
at least one process gas supply part supplying a process gas through a side surface of the upper liner; and
a flow path through which a purge gas, supplied through the lower dome, is supplied.

7. The substrate processing apparatus of claim 1, wherein the upper liner comprises:
a first opening formed on one side of the upper liner to exhaust a gas; and
a second opening disposed in the upper liner to provide a substrate path to the other side opposing the first opening of the upper liner.

8. The substrate processing apparatus of claim 1, wherein the lamp heater includes a plurality of ring-shaped lamp heaters,
the ring-shaped lamp heaters are arranged at regular intervals along an inclined surface of the lower dome, and
the ring-shaped lamp heaters are divided into three groups to independently receive power.

9. The substrate processing apparatus of claim 1, further comprising:
a first substrate lifter disposed along a central axis of the lower dome; and
a second substrate lifter disposed to be coaxial with the first substrate lifter.

10. The substrate processing apparatus of claim 1, further comprising: a ring-shaped heat insulating part disposed between a lower surface of the chamber and a reflector.

11. The substrate processing apparatus of claim 1, further comprising: a lower liner disposed on an internal circumferential surface of the lower dome and formed of an opaque dielectric material.

12. The substrate processing apparatus of claim 11, wherein the lower liner has an internal circumferential surface facing a space of the lower dome, and the internal circumferential surface of the lower liner has an inclination in which a thickness is increased in a vertical direction toward an upper region from a lower region of the chamber.

13. The substrate processing apparatus of claim 1, further comprising:
a lower dome covering a lower surface of the chamber, formed of a transparent dielectric material, and having the same curvature as the upper dome;
a lamp heater disposed on a lower surface of the lower dome;
a ring-shaped upper liner disposed on an internal side of the chamber to surround a lower side edge of the upper dome and formed of a dielectric material;
a ring-shaped lower liner disposed on the internal side of the chamber to surround an upper edge internal circumferential surface of the lower dome and formed of a dielectric material; and
a reflector disposed on a lower surface of the lamp heater.

14. The substrate processing apparatus of claim 1, further comprising:
an antenna housing disposed to surround the antenna,
wherein the antenna housing is heated by a separate heater.

15. The substrate processing apparatus of claim 14, wherein a temperature of the antenna housing ranges from 200 degrees Celsius to 600 degrees Celsius.

16. The substrate processing apparatus of claim 14, further comprising:
a chamber housing disposed to surround the antenna housing while being spaced apart from the antenna housing,
wherein the chamber housing is cooled by a refrigerant.

17. A method of operating a substrate processing apparatus including a chamber having a sidewall, a susceptor mounting a substrate inside the chamber, an upper dome covering an upper surface of the chamber and formed of a transparent dielectric material, an antenna disposed on the upper dome to generate inductively coupled plasma, a lower dome covering a lower surface of the chamber and formed of a transparent dielectric material, a ring-shaped upper liner disposed on an internal side of the chamber to surround a lower side edge of the upper dome and formed of a dielectric material; a ring-shaped lower liner disposed on an internal side of the chamber to surround an upper edge internal circumferential surface of the lower dome and formed of a dielectric material, a lamp heater disposed below the lower dome, and an antenna housing disposed to cover the antenna and heated by a heater, the method comprising:
heating the antenna housing by the heater to a first temperature;
accommodating the substrate in a home position of the susceptor and lifting the susceptor to change a position of the substrate to a process position;
supplying a process gas to the upper dome, supplying a purge gas to the lower dome, and heating the substrate using the lamp heater; and
supplying radio-frequency (RF) power to the antenna to generate inductively coupled plasma to perform epitaxial growth on the substrate.

18. A substrate processing apparatus comprising:
a chamber having a side wall, an upper region, and a lower region;
a susceptor mounting a substrate inside the chamber;
an upper dome covering an upper surface of the chamber and formed of a transparent dielectric material;
a lower dome covering a lower surface of the chamber and formed of a transparent dielectric material;
a substrate entrance disposed on one side of the side wall of the chamber; and
an exhaust port disposed on the other side of the side wall of the chamber,
wherein an upper surface of the exhaust port has the same height as or a smaller height than an upper surface of the substrate entrance,
further comprising:
a ring-shaped upper liner disposed on an internal side of the chamber to surround a lower side edge of the upper dome and formed of a transparent dielectric material; and
a ring-shaped lower liner disposed on the internal side of the chamber to surround an upper edge internal circumferential surface of the lower dome and formed of an opaque dielectric material.

19. The substrate processing apparatus of claim 18, wherein the upper liner comprises:
a first opening aligned with the exhaust port and formed on one side of the upper liner to exhaust a gas; and
a second opening aligned with the substrate entrance and disposed in the upper liner to provide a substrate path to the other side opposing the first opening of the upper liner, and
wherein an upper surface of the susceptor is higher than lower surfaces of the exhaust port and the substrate entrance during a process.

* * * * *